United States Patent
Xiao

(10) Patent No.: US 8,513,035 B2
(45) Date of Patent: Aug. 20, 2013

(54) LED CHIP, LED AND A METHOD FOR MANUFACTURING LED CHIP

(75) Inventor: Zhaoxin Xiao, Guangdong (CN)

(73) Assignee: Shenzhen Refond Optoelectronics Co., Ltd., Guangdong (CN)

( * ) Notice: Subject to any disclaimer, the term of this patent is extended or adjusted under 35 U.S.C. 154(b) by 0 days.

(21) Appl. No.: 13/393,939

(22) PCT Filed: Sep. 23, 2011

(86) PCT No.: PCT/CN2011/080073
§ 371 (c)(1),
(2), (4) Date: Mar. 2, 2012

(87) PCT Pub. No.: WO2012/048616
PCT Pub. Date: Apr. 19, 2012

(65) Prior Publication Data
US 2012/0205704 A1    Aug. 16, 2012

(30) Foreign Application Priority Data
Oct. 15, 2010   (CN) .......................... 2010 1 0510058

(51) Int. Cl.
H01L 33/40    (2010.01)
H01L 33/42    (2010.01)
H01L 21/00    (2006.01)

(52) U.S. Cl.
USPC .................. 438/29; 438/39; 438/42; 257/98; 257/E33.061

(58) Field of Classification Search
USPC ........................ 438/29, 42; 257/98, E33.061
See application file for complete search history.

(56) References Cited

U.S. PATENT DOCUMENTS

| | | | | |
|---|---|---|---|---|
| 8,189,642 | B1 * | 5/2012 | Li et al. | 372/50.124 |
| 2008/0121872 | A1 * | 5/2008 | Choi et al. | 257/40 |
| 2011/0198567 | A1 * | 8/2011 | Shinohara et al. | 257/13 |
| 2011/0198650 | A1 * | 8/2011 | Hsieh et al. | 257/98 |
| 2011/0233590 | A1 * | 9/2011 | Beom et al. | 257/98 |
| 2012/0298950 | A1 * | 11/2012 | Basceri et al. | 257/13 |

* cited by examiner

*Primary Examiner* — Angel Roman
(74) *Attorney, Agent, or Firm* — Rankin Hill & Clark LLP

(57) ABSTRACT

The present invention relates to illuminating field, especially relates to LED chip, LED and a method of manufacturing LED chip, the method of manufacturing LED chip comprises: forming a first semiconductor layer, a luminous layer and a second semiconductor layer sequentially on a substrate; forming a phosphor powder layer on the second semiconductor layer; removing a part of the phosphor powder layer and a part of the second semiconductor layer to form at least one groove which exposes a part of the second semiconductor layer; removing a part of the phosphor powder layer, a part of the second semiconductor layer, a part of the luminous layer and a part of the first semiconductor layer to form at least one unfilled corner which exposes a part of the first semiconductor layer; forming a first electrode in the unfilled corner, and forming a second electrode in the groove. In the present invention, the process of coating phosphor powder in manufacturing LED is brought into the course of LED chip manufacturing, the advantages of this procedure are simple, controllable, to improve the light extraction efficiency of LED, to save a lot of phosphor powder and to greatly reduce the cost.

18 Claims, 6 Drawing Sheets

LED CHIP, LED AND A METHOD FOR MANUFACTURING LED CHIP

TECHNICAL FIELD

The present invention relates to illuminating field, especially relates to LED chip, LED, and a method for manufacturing LED chip.

BACKGROUND

It is well known that, as a new generation of green illuminating light source, LED has many advantages such as high luminous efficiency, long lifetime, vivid colour, energy-saving, environment-protecting and the like, and it has more and more extensive application fields such as indoor and outdoor illuminating, backlight source, medical field, transportation, plant growth and so on.

An LED chip is an critical component of the LED, and there are two paths to improve the luminous efficiency of LED products, one is improving the photo-electricity parameters of the LED chip and the other is developing new technologies of coating phosphor powder, wherein the photo-electricity parameters of LED chip products are improved mostly by chip manufacturers, and the new technologies of coating phosphor powder are developed continuously by packaging plants.

In prior art, the process of coating phosphor powder in LED manufacturing includes such packaging modes as phosphor powder being far away from the chip, phosphor powder uniformly distributed in packaging material and phosphor powder attached tightly to the chip surface. The packaging mode of phosphor powder uniformly distributed in packaging material among others is easy to be performed, but in this mode the phosphor powder has low excitation efficiency. The mode of phosphor powder being far away from the chip has not been yet industrially produced due to its complex and uncontrollable process. The mode of phosphor powder attached tightly to the chip surface is achieved by bonding the phosphor powder to the chip by means of intermediate packaging material, the defect of which is the refractive index of the intermediate package material is low, therefore the light emitted by the chip is easy to be totally reflected, which results in heat accumulating and reduces the light extraction efficiency of the chip and affects excitation of the phosphor powder (the excitation temperature of the phosphor powder is relatively high). Coating phosphor powder directly on the semi-finished products which has been die attached and wire bound may waste a number of phosphor powder.

SUMMARY

The objective of the examples according to the present invention is to provide a method for manufacturing LED chip, and the present invention also aims at solving the problem that phosphor powder layer does not locate on the LED chip surface during the course of manufacturing the LED chip in prior art, thereby resulting low light extraction efficiency of LED, and wasting a large amount of phosphor powder in subsequent procedures.

The examples of the present invention are achieved as follows: a method for manufacturing LED chip, which comprises:

forming a first semiconductor layer, a luminous layer and a second semiconductor layer sequentially on a substrate;
forming a phosphor powder layer on the second semiconductor layer;
removing a part of the phosphor powder layer and a part of the second semiconductor layer to form at least one groove which exposes a part of the second semiconductor layer;
removing a part of the phosphor powder layer, a part of the second semiconductor layer, a part of the luminous layer and a part of the first semiconductor layer to form at least one unfilled corner which exposes a part of the first semiconductor layer;
forming a first electrode at the unfilled corner, and forming a second electrode in the groove.

Another objective of the examples of the present invention is to provide an LED chip produced by using the method of the present invention.

Another objective of the examples of the present invention is to provide an LED comprising the LED chip of the present invention.

In the examples of the present invention, the process of coating phosphor powder in manufacturing LED is brought into the course of LED chip manufacturing, the advantages of this procedure are simple, controllable, to improve the light extraction efficiency of LED, to save a lot of phosphor powder and to greatly reduce the cost.

DETAILED DESCRIPTION OF THE PREFERRED EMBODIMENTS

In order to make the objectives, the technique procedures and advantages of the present invention more clearly understood, the present invention will be further detailed in conjunction with the drawings and examples. It should be appreciated that, the specific examples described herein are only to explain, but not limit, the present invention.

In the examples of the present invention, the process of coating phosphor powder in manufacturing LED is brought into the course of LED chip manufacturing, the advantages of this procedure are simple, controllable, to improve the light extraction efficiency of LED, to save a lot of phosphor powder and to greatly reduce the cost.

The method for manufacturing an LED chip provided in the examples of the present invention comprises:

forming a first semiconductor layer, a luminous layer and second semiconductor layer sequentially on a substrate;

forming a phosphor powder layer on the second semiconductor layer;

removing a part of the phosphor powder layer and a part of the second semiconductor layer to form at least one groove which exposes a part of the second semiconductor layer;

removing a part of the phosphor powder layer, a part of the second semiconductor layer, a part of the luminous layer and a part of the first semiconductor layer to form at least one unfilled corner which exposes a part of the first semiconductor layer;

forming a first electrode at the unfilled corner, and forming a second electrode in the groove.

The LED chip provided in the examples of the present invention is made by the above-mentioned method.

The LED provided in the examples of the present invention comprises the above-said LED chip.

Now the accomplishment of the present invention will be described in detail with combination of specific examples.

Figure 1:
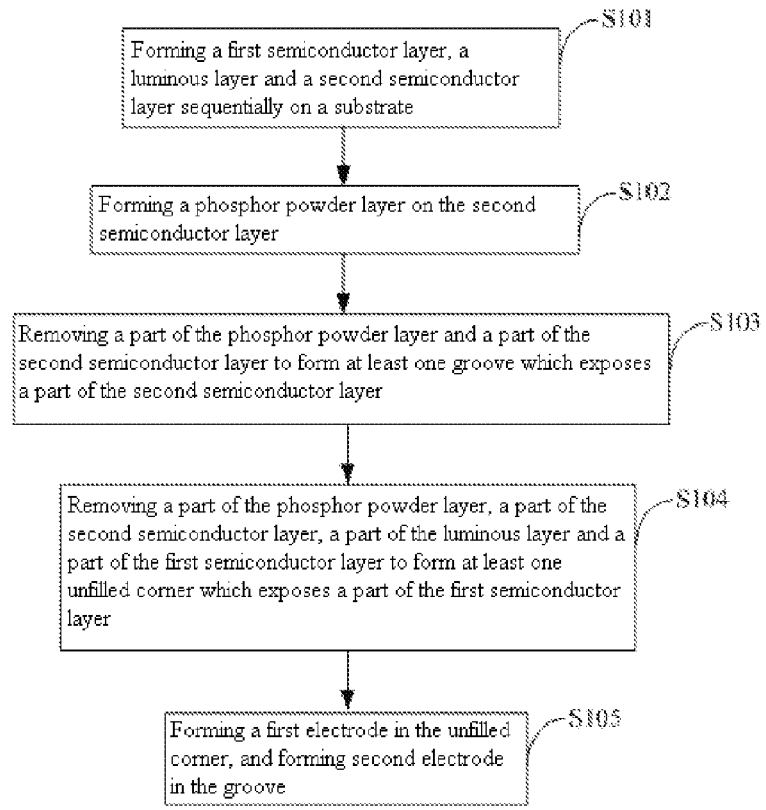
FIG. 1 is a flow chart of the LED chip manufacturing method according to the examples of the present invention.
Figure 2:
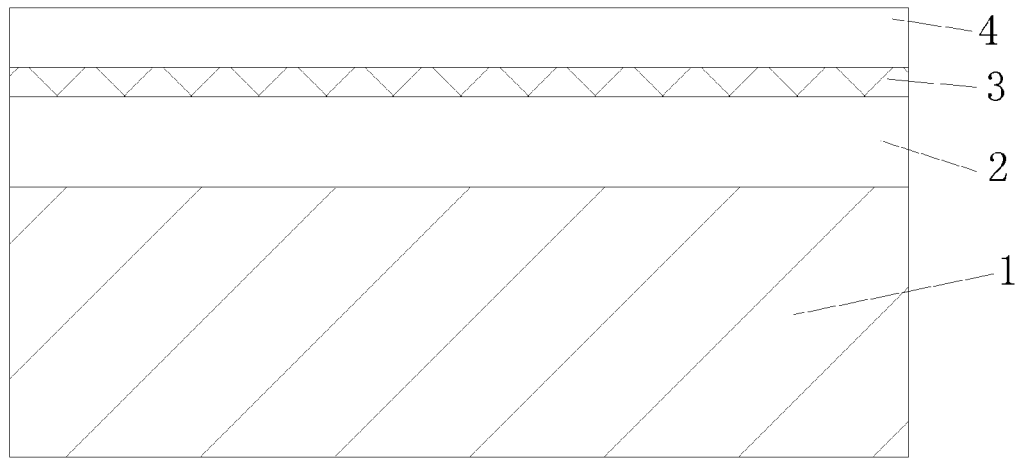
FIG. 2 is a schematic view of the structure of the epitaxial wafer.

FIG. 1 shows the procedure of manufacturing LED chip according to the examples of the present invention, detailed as follows:

In step S101, a first semiconductor layer, a luminous layer and a second semiconductor layer are formed sequentially on a substrate;

With reference to FIG. 2, the first semiconductor layer 2 is first grown on the substrate 1, thereafter the luminous layer 3 is deposited on the first semiconductor layer 2, and then the second semiconductor layer 4 is grown on the luminous layer 3, thus an epitaxial wafer is formed. Therein, the material of the substrate 1 is, for example, but not limited to, sapphire, silicon, silicon carbide or alloy, meanwhile the material preferably has the characteristic of thermal conductivity.

Generally, the first semiconductor layer 2 is an N-type semiconductor layer (such as N-GaN), and the second semiconductor layer 4 is a P-type semiconductor layer (such as P-GaN), and the luminous layer 3 is, for example, but not limited to, an energy gap layer or Multiple Qutum Well (MQW).

In step S102, the phosphor powder layer is formed on the second semiconductor layer.

Figure 3:
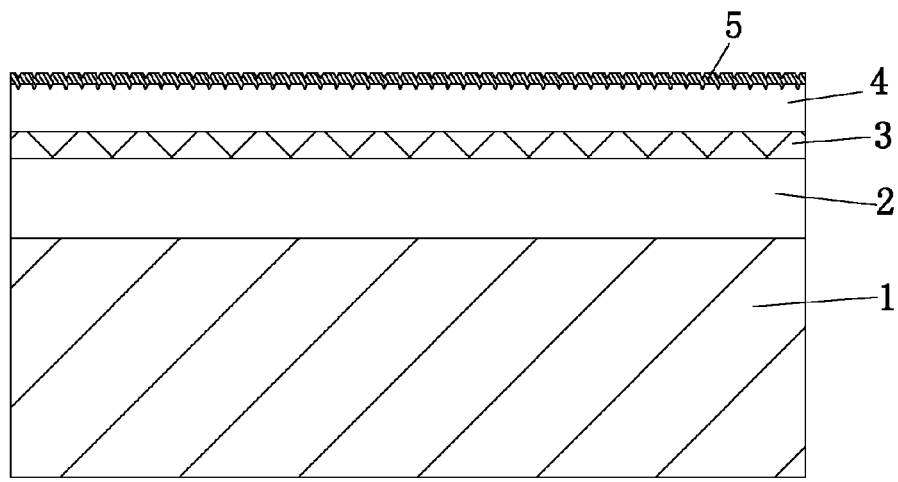
FIG. 3 is a schematic view of the epitaxial wafer after having transparent conductive layer formed on it.

As one example of the present invention, the transparent conductive layer 5 (TCL) is first formed on the second semiconductor layer 4, forming the transparent conductive layer 5(such as ITO, indium tin oxide semiconductor) on the second semiconductor layer 4 by means of evaporation, as shown in FIG. 3. The transparent conductive layer 5 makes electrical current distributed in the second semiconductor layer 4 in a uniform fashion, and thus making the LED chip emit light more uniformly.

Figure 4:
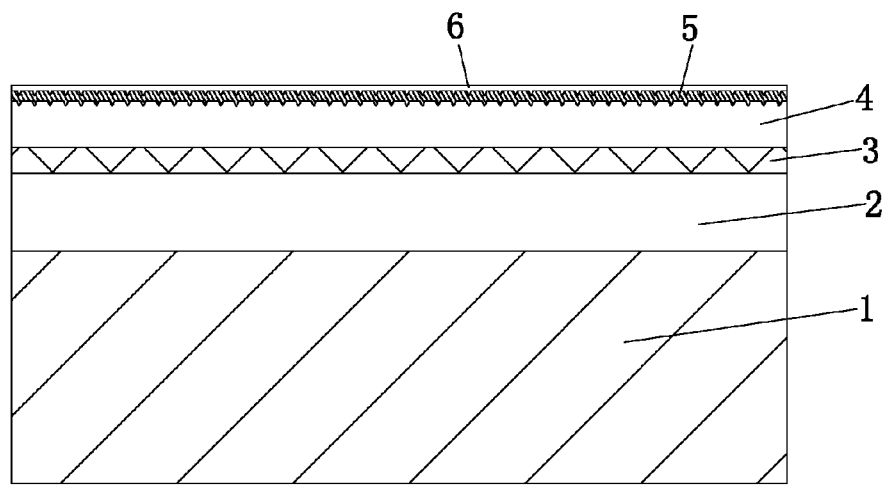
FIG. 4 is a schematic view of the phosphor powder layer forming on the transparent conductive layer.

With reference to FIG. 4, the phosphor powder layer 6 is formed on the transparent conductive layer 5. In the example of the invention, by employing a magnetron sputtering coater, phosphor powder layer 6 is coated on the transparent conductive layer 5, using phosphor powder (such as yellow phosphor powder) as target material, which matches the LED chip (such blue light LED chip), and the processing parameters are as follows:

a. a shielding gas is injected into the magnetron sputtering coater, and preferably, the shielding gas is argon (Ar);

b. adjusting the position of the phosphor powder (target material), the distance between the phosphor powder (target material) and the transparent conductive layer 5 being 20-50 mm;

c. the vacuum degree of the magnetron sputtering coater is brought to no more than $2*10^{-3}$ Pa by vacuum pumping;

d. the power of sputtering is 200-500 W;

e. the sputtering time depends on the thickness of the phosphor powder layer 6 (0.1-10 µm), which is usually 20-120 min.

In the manufacturing process of LED chip according to the example of the invention, the phosphor powder layer is formed on the epitaxial wafer, and this manufacturing process uses less phosphor powder, and the cost is low.

Preferably, the surface of the second semiconductor layer 4 can be coarsened before the transparent conductive layer 5 is evaporated, so as to make the transparent conductive layer 5 and the second semiconductor layer 4 connected together more tightly, and to improve the reliability of the chip. It is sure that, the surface of the transparent conductive layer 5 can be coarsened before the phosphor powder layer 6 is formed on the transparent conductive layer 5, so as to make the transparent conductive layer 5 and the phosphor powder layer 6 connected together tightly, and to improve the reliability of the chip.

Figure 5:
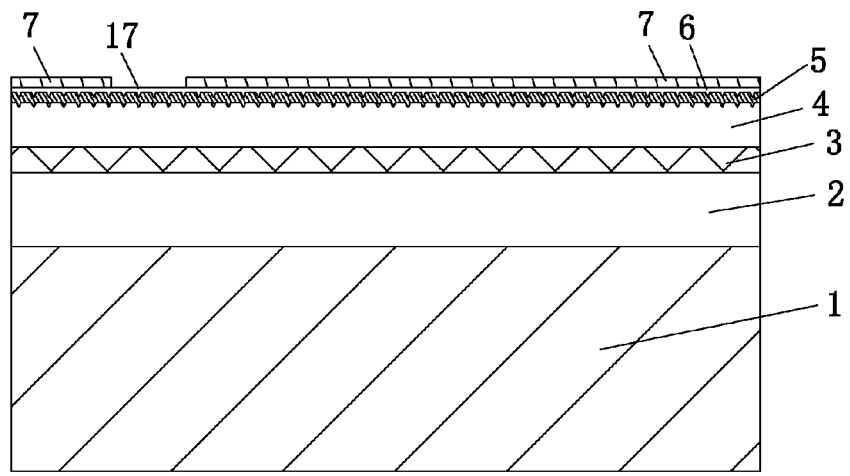
FIG. 5 is a schematic view of the first photoresist layer forming on the phosphor powder layer.
Figure 6:
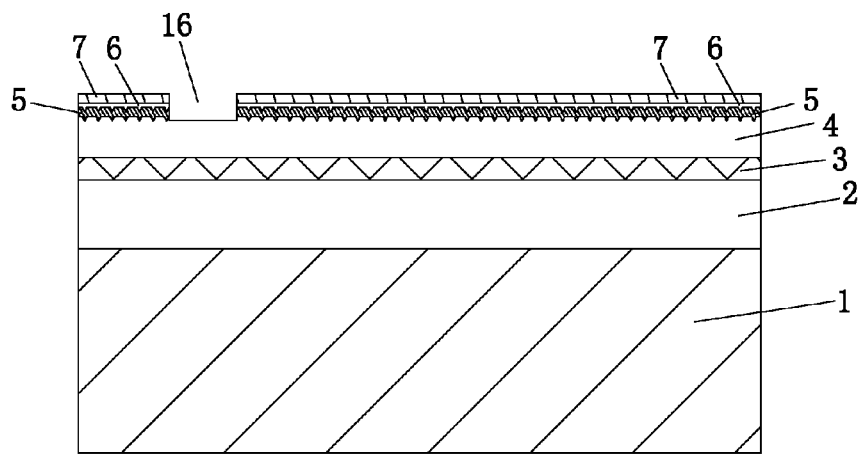
FIG. 6 is a schematic view of etching to the second semiconductor layer.

In step S103, a part of the phosphor powder layer and a part of the second semiconductor layer are removed out to form at least one groove, which exposes a part of the second semiconductor layer;

As shown in FIG. 5, a photoetching glue is first coated on the phosphor powder layer 6 to form a first photoresist layer 7 with the thickness of 0.5-2.0 mm, and the first photoresist layer 7 exposes a part of the phosphor powder layer 17. Then the phosphor powder layer is wet etched in diluted NaOH solution (concentration of 0.01 mol/L) to remove the exposed part of the phosphor powder layer 17. And then it is etched to the second semiconductor layer using inductively coupled plasma reactor (ICP) to remove a part of the second semiconductor layer and to form the groove 16, as shown in FIG. 6. Then the photoresist agent is removed by employing the process of exposure and development.

In step S104, a part of the phosphor powder layer, a part of the second semiconductor layer, a part of luminous layer and a part of the first semiconductor layer are removed to form at least one unfilled corner exposing a part of the first semiconductor layer.

Figure 7:
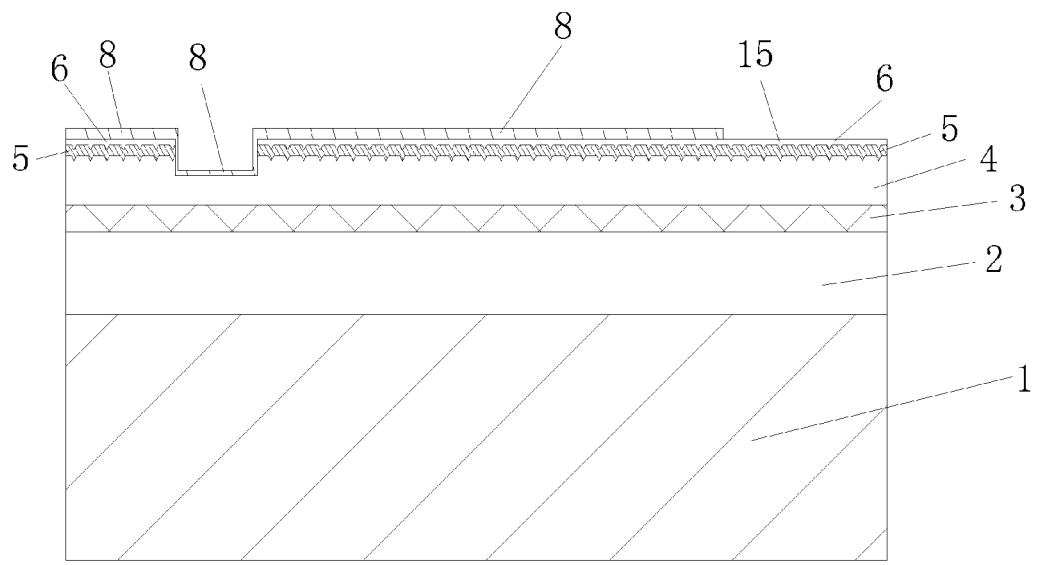
FIG. 7 is a schematic view of formation of the second photoresist layer.
Figure 8:
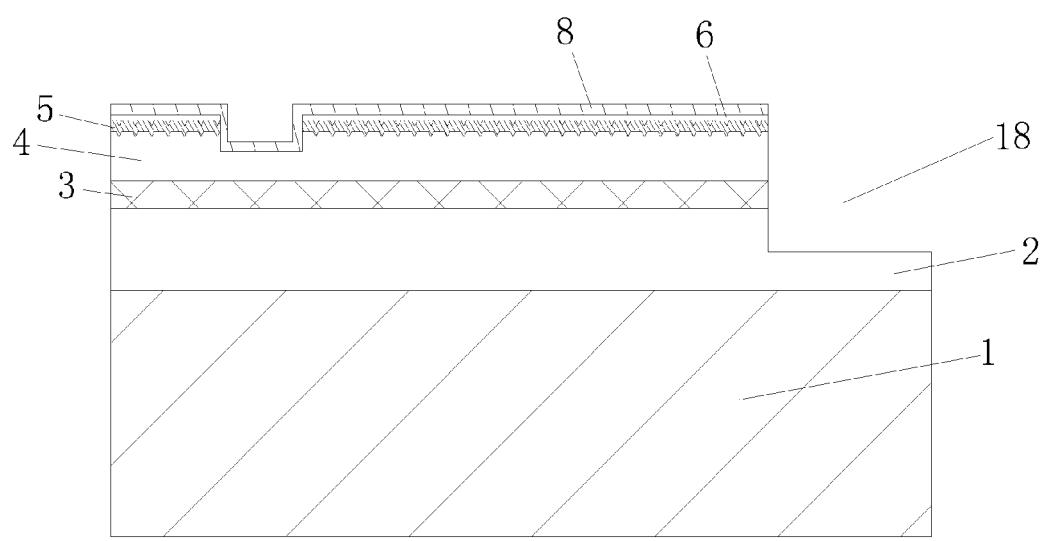
FIG. 8 is a schematic view of etching to the first semiconductor layer.

With reference to FIG. 7, a photoetching glue is first coated on the phosphor powder layer 6 and the groove 16 to form the second photoresist layer 8 with the thickness of 0.5-2.0 mm, and the second photoresist layer 8 exposes the phosphor powder layer 15 on the edge of the second photoresist layer 8. Then the phosphor powder layer is wet etched in diluted NaOH solution(concentration of 0.01 mol/L) to remove the phosphor powder layer 15 on the edge of the second photoresist layer 8. Thereafter, it is etched to the first semiconductor layer 2 using inductively coupled plasma reactor (ICP) to remove a part of the phosphor powder layer, a part of the second semiconductor layer, a part of the luminous layer and a part of the first semiconductor layer and to form a unfilled corner 18, and the unfilled corner 18 includes a plane part and a upright part, as shown in FIG. 8. Then the photoresist agent is removed by employing the process of exposure and development.

In step S105, the first electrode is formed in the unfilled corner, and the second electrode is formed in the groove.

Figure 9:
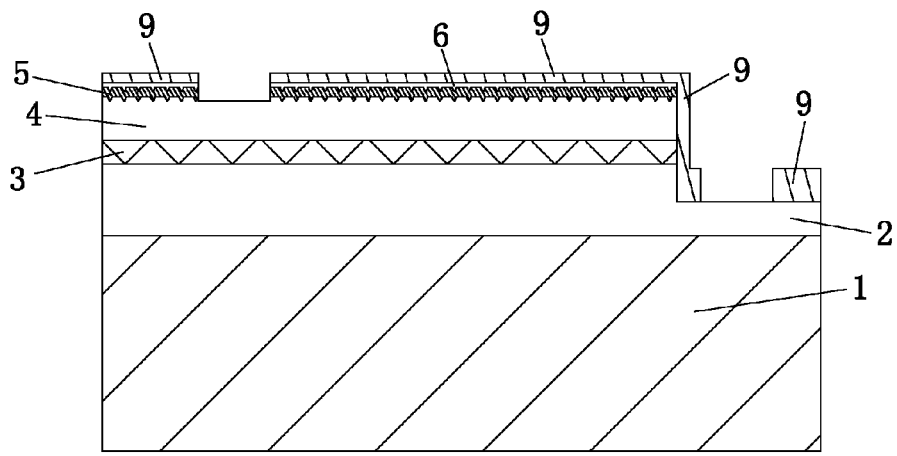
FIG. 9 is a schematic view of formation of the third photoresist layer.
Figure 10:
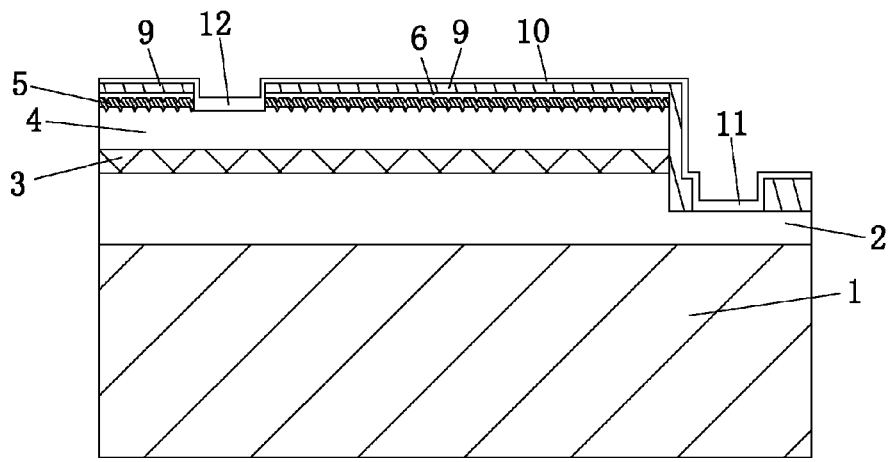
FIG. 10 is a schematic view of formation of metal electrode.
Figure 11:
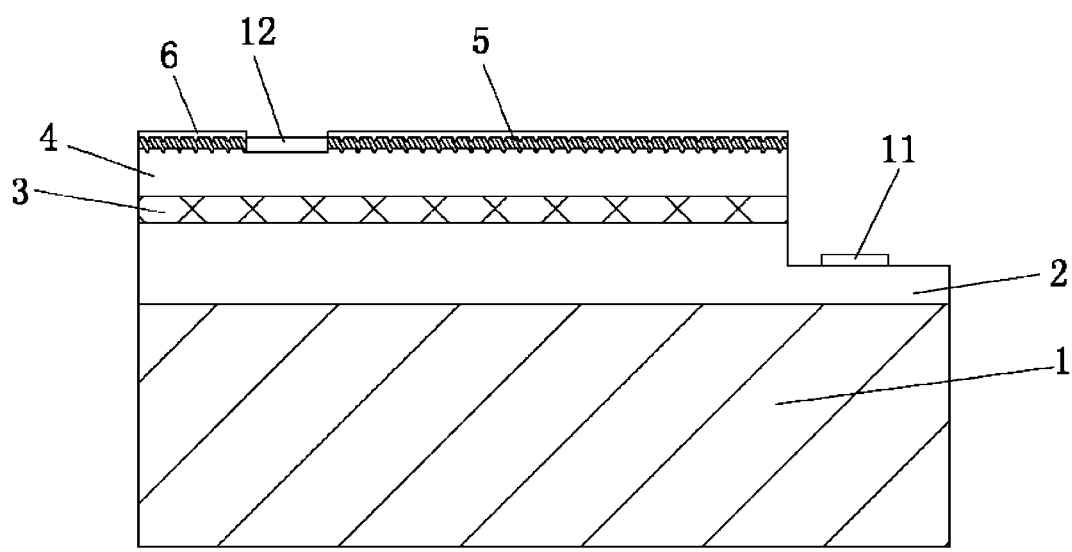
FIG. 11 is a schematic view of the structure of the LED chip.

With reference to FIG. 9, photoetching glue is first coated both on the phosphor powder layer and in the unfilled corner 18 to form a third photoresist layer 9 with thickness of 0.5-2.0 mm, which exposes the portion where to be installed with electrodes in the groove 16 and the unfilled corner. Then electrodes are evaporated, preferably using metal such as Au, to form a metal coating 10 on the third photoresist layer 9, to form a first electrode 11 (such as negative electrode) in the unfilled corner 18 i.e. the exposed first semiconductor layer, and to form a second electrode 12 (such as positive electrode) in the groove 16 i.e. the exposed second semiconductor layer, as shown in FIG. 10. Then the photoresist agent and the coating on the third photoresist layer 9 are removed by employing the process of exposure, development and washing, to form an LED chip (such as a white light LED chip), which may be packaged directly into the LED with desired color (such as white light LED) by means of using transparent glue, as shown in FIG. 11. The light emitted by the LED chip accesses directly into the phosphor powder layer with higher refractive index, which reduces the probability of total reflection, increases emitted light while reducing the temperature of the chip. In addition, the phosphor powder layer directly receives light emitted by the LED chip, without any loss due to absorption, and thus it is more easily to be excited. The LED chip with larger size, of course, can be cut into small LED chips with desired size.

In the example of the present invention, the process of coating phosphor powder in manufacturing LED is brought into the course of LED chip manufacturing, the advantages of this procedure are simple, controllable, to improve the light extraction efficiency of LED, to save a lot of phosphor powder and to greatly reduce the cost. A transparent conductive layer is first formed on the second semiconductor layer, then a phosphor powder layer is formed on the transparent semiconductor layer, in order to make the LED emit light uniformly. Additionally, the phosphor powder layer is formed on the transparent conductive layer by employing a magnetron sputtering coater, using phosphor powder as target material, and this procedure is easy to be manipulated.

The description hereinabove is only the preferred example of the present invention, but not to limit the present invention, and all such modifications, alternatives and improvements that fall within the spirit and broad scope of the present invention, are intended to be embraced in the scope of the present invention.

What is claimed is:

1. A method of manufacturing LED chip comprising:
   forming a first semiconductor layer, a luminous layer and a second semiconductor layer sequentially on a substrate;
   forming a phosphor powder layer on the second semiconductor layer;
   removing a part of the phosphor powder layer and a part of the second semiconductor layer to form at least one groove which exposes a part of the second semiconductor layer;
   removing a part of the phosphor powder layer, a part of the second semiconductor layer, a part of the luminous layer and a part of the first semiconductor layer to form at least one unfilled corner which exposes a part of the first semiconductor layer;
   forming a first electrode in the unfilled corner, and forming second electrode in the groove.

2. The method of manufacturing LED chip according to claim 1, wherein before the step of forming a phosphor powder layer on the second semiconductor layer, further comprising:
   forming a transparent conductive layer on the second semiconductor layer.

3. The method of manufacturing LED chip according to claim 2, wherein the thickness of the said phosphor powder layer is 0.1~10 um, and both the second semiconductor layer and the transparent conductive layer are coarsening treated, and the said phosphor powder layer is formed on the said transparent conductive layer.

4. The method of manufacturing LED chip according to claim 3, wherein the phosphor powder layer is formed on the transparent conductive layer by employing a magnetron sputtering coater, the specific step comprising:
   a shielding gas is injected into the magnetron sputtering coater;
   using phosphor powder as target material, and adjusting the position of the target material, the distance between the target material and the transparent conductive layer being 20-50 mm;
   the vacuum degree of the magnetron sputtering coater is brought to no more than $2*10^{-3}$ Pa by vacuum pumping;
   the power of sputtering is 200-500 W.

5. The method of manufacturing LED chip according to claim 1, wherein the specific procedure of the step of removing a part of the phosphor powder layer and a part of the second semiconductor layer to form at least one groove which exposes a part of the second semiconductor layer is:
   a photoetching glue is first coated on the phosphor powder layer to form first photoresist layer which exposes a part of the phosphor powder layer;
   the phosphor powder layer is etched to remove the exposed part of the phosphor powder layer;
   it is etched to the second semiconductor layer and remove the part of the second semiconductor layer and form one groove;
   the photoresist agent is removed by employing the process of exposure and development.

6. The method of manufacturing LED chip according to claim 5, wherein the specific procedure of the step of removing a part of the phosphor powder layer, a part of the second semiconductor layer, a part of the luminous layer and a part of the first semiconductor layer to form at least one unfilled corner which exposes a part of the first semiconductor layer is:
   a photoetching glue is coated on the phosphor powder layer and on the groove to form a second photoresist layer which exposes the phosphor powder layer on the edge of the second photoresist layer;
   the phosphor powder layer is etched to remove the phosphor powder layer on the edge of the second photoresist layer;
   it is etched to the first semiconductor layer to remove the part of the phosphor powder layer, the part of the second semiconductor layer, the part of the luminous layer and the part of the first semiconductor layer and form one groove;
   the photoresist agent is removed by employing the process of exposure and development.

7. The method of manufacturing LED chip according to claim 5 or claim 6, wherein the phosphor powder layer is wet etched in NaOH solution.

8. The method of manufacturing LED chip according to claim 6, wherein the specific procedure of the step of forming a first electrode in the unfilled corner, and forming a second electrode in the groove is:
   a photoetching glue is coated both on the phosphor powder layer and in the unfilled corner to form a third photoresist layer which exposes the portion where to be installed with electrodes in the groove and the unfilled corner;
   electrodes are evaporated, to form the first electrode in the unfilled corner, and form the second electrode in groove;

the photoresist agent and the coating on the third photoresist layer are removed by employing the process of exposure, development and washing.

9. An LED chip, comprising:
a first semiconductor layer, a luminous layer and a second semiconductor layer sequentially formed on a substrate;
a phosphor powder layer on the second semiconductor layer;
at least one groove which exposes a part of the second semiconductor layer;
at least one unfilled corner which exposes a part of the first semiconductor layer;
a first electrode in the unfilled corner, and second electrode in the groove.

10. An LED, wherein the LED comprises the LED chip according to claim 9.

11. The LED chip according to claim 9, further comprising:
a transparent conductive layer on the second semiconductor layer.

12. The LED chip according to claim 10, wherein the thickness of the said phosphor powder layer is 0.1-10 gym, and both the second semiconductor layer and the transparent conductive layer are coarsening treated, and the said phosphor powder layer is formed on the said transparent conductive layer.

13. The LED chip according to claim 11, wherein the phosphor powder layer is formed on the transparent conductive layer by employing a magnetron sputtering coater, the specific step comprising:
a shielding gas is injected into the magnetron sputtering coater;
using phosphor powder as target material, and adjusting the position of the target material, the distance between the target material and the transparent conductive layer being 20-50 mm;
the vacuum degree of the magnetron sputtering coater is brought to no more than 2*10-3 Pa by vacuum pumping;
the power of sputtering is 200-500 W.

14. The LED chip according to claim 12, wherein the at least one groove which exposes a part of the second semiconductor layer is formed through the following processes:
a photoetching glue is first coated on the phosphor powder layer to form first photoresist layer which exposes a part of the phosphor powder layer;
the phosphor powder layer is etched to remove the exposed part of the phosphor powder layer;
it is etched to the second semiconductor layer and remove the part of the second semiconductor layer and form one groove;
the photoresist agent is removed by employing the process of exposure and development.

15. The LED chip according to claim 13, wherein the at least one unfilled corner which exposes a part of the first semiconductor layer is formed through the following processes:
a photoetching glue is coated on the phosphor powder layer and on the groove to form a second photoresist layer which exposes the phosphor powder layer on the edge of the second photoresist layer;
the phosphor powder layer is etched to remove the phosphor powder layer on the edge of the second photoresist layer;
it is etched to the first semiconductor layer to remove the part of the pho sphor powder layer, the part of the second semiconductor layer, the part of the luminous layer and the part of the first semiconductor layer and form one groove;
the photoresist agent is removed by employing the process of exposure and development.

16. The LED chip according to claim 14 wherein the phosphor powder layer is wet etched in NaOH solution.

17. The LED chip according to claim 15, wherein the first electrode in the unfilled corner and the second electrode in the groove are formed through the following processes:
a photoetching glue is coated both on the phosphor powder layer and in the unfilled corner to form a third photoresist layer which exposes the portion where to be installed with electrodes in the groove and the unfilled corner;
electrodes are evaporated, to form the first electrode in the unfilled corner, and form the second electrode in groove;
the photoresist agent and the coating on the third photoresist layer are removed by employing the process of exposure, development and washing.

18. The method of manufacturing LED chip according to claim 6, wherein the phosphor powder layer is wet etched in NaOH solution.

* * * * *